(12) United States Patent
Arai

(10) Patent No.: US 6,897,695 B2
(45) Date of Patent: May 24, 2005

(54) SEMICONDUCTOR INTEGRATED CIRCUIT DEVICE AND METHOD OF DETECTING DELAY ERROR IN THE SAME

(75) Inventor: Minari Arai, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 10/729,457

(22) Filed: Dec. 5, 2003

(65) Prior Publication Data

US 2004/0113670 A1  Jun. 17, 2004

(30) Foreign Application Priority Data

Dec. 6, 2002 (JP) .................................... 2002-354993

(51) Int. Cl.[7] .............................................. H03L 7/00
(52) U.S. Cl. .................................... 327/161; 327/153
(58) Field of Search ................................ 327/147, 149, 327/153, 156, 158, 161, 291, 292, 293, 294, 299

(56) References Cited

U.S. PATENT DOCUMENTS 6,351,166 B2 * 2/2002 Hashimoto .................. 327/158
6,433,607 B2 * 8/2002 Kawasaki et al. .......... 327/299

FOREIGN PATENT DOCUMENTS

| JP | 10-320976 | 12/1998 |
|----|-----------|---------|
| JP | 2000-163999 | 6/2000 |
| JP | 2001-126474 | 5/2001 |

* cited by examiner

*Primary Examiner*—Linh My Nguyen
(74) *Attorney, Agent, or Firm*—Katten Muchin Zavis Rosenman

(57) ABSTRACT

A semiconductor integrated circuit device including (a) an actual input circuit (03A, 04A), (b) an actual output circuit (05A, 06A), (c) a replica input circuit (12A) having the same characteristics as those of the actual input circuit, (d) a replica output circuit (11A) having the same characteristics as those of the actual input circuit, (e) an oscillating circuit (15A) which operates in accordance with external triggers, and (f) a skew-comparing circuit (10A) which compares a signal transmitted from the oscillating circuit and passing through the actual input circuit and the actual output circuit, to a signal transmitted from the oscillating circuit and passing through the replica input circuit and the replica output circuit to detect a delay error between the actual input and output circuits and the replica input and output circuits, wherein delays in the replica input and output circuits are compensated for in accordance with the delay error detected by the skew-comparing circuit.

4 Claims, 11 Drawing Sheets

SEMICONDUCTOR INTEGRATED CIRCUIT DEVICE AND METHOD OF DETECTING DELAY ERROR IN THE SAME

BACKGROUND OF THE INVENTION

1. Field of the Invention

The invention relates to a semiconductor integrated circuit device including an actual circuit and a replica circuit thereof, and more particularly to such a semiconductor integrated circuit device which is capable of detecting a delay error between an actual circuit and a replica circuit and compensating for the detected delay error.

2. Description of the Related Art

In general, a semiconductor integrated circuit device including a delay and phase-synchronization circuit such as DLL (Delay Locked Loop) or PLL (Phase Locked Loop) in order to control phases of input and output timings is designed to further include replica circuits of output and input circuits for controlling delay or phase.

For instance, Japanese Patent Application Publication No. 2001-126474 has suggested such a semiconductor integrated circuit device.

FIG. 1 is a block diagram of a conventional semiconductor integrated circuit device including a delay and phase-synchronization circuit having a replica input circuit and a replica output circuit.

The illustrated semiconductor integrated circuit device is comprised of a first pad 01K to which data is input and from which data and a signal IO1 are output, a second pad 02K to which data is input and from which data and a signal IO2 are output, a first input circuit 03K, a second input circuit 04K, a first output circuit 05K, a second output circuit 06K, and a delay and phase-synchronization circuit 09K.

The first input circuit 03K receives a signal VREF as a reference level signal, amplifies the signal IO1 output from the first pad 01K, and outputs the thus amplified signal as a signal DIN1.

The second input circuit 04K receives a signal VREF as a reference level signal, amplifies the signal IO2 output from the second pad 02K, and outputs the thus amplified signal as a signal DIN2.

The first output circuit 05K receives signals OE and DATA1 as output enable signals, and outputs a signal OUT1 to the first pad 01K as the signal IO1.

The second output circuit 06K receives signals OE and DATA2 as output enable signals, and outputs a signal OUT2 to the second pad 02K as the signal IO2.

The delay and phase-synchronization circuit 09K includes a replica output circuit 07K and a replica input circuit 08K.

The replica output circuit 07K receives a signal DCLK, and outputs a signal ROD.

The replica input circuit 08K receives a signal VREF as a reference level signal, amplifies the signal ROD output from the replica output circuit 07K, and outputs a signal REPD.

The signal DATA1 input into the first output circuit 05K and the signal DATA2 input into the second output circuit 06K are signals delayed by the delay and phase-synchronization signal 09K or synchronized with a signal having a synchronized phase.

FIG. 2 is a circuit diagram of the replica output circuit 07K comprised of delay devices such as an inverter, a buffer and so on, and providing a delay identical to a delay detected in an actual circuit path. The replica input circuit 08K has the same structure as that of the replica output circuit 07K.

The replica output circuit 07K illustrated in FIG. 2 is comprised of a first buffer 01L receiving a signal RIN and outputting a signal RID1, a second buffer 02L receiving the signal RID1 transmitted from the first buffer 01L, and outputting a signal RID2, a third buffer 03L receiving the signal RID2 transmitted from the second buffer 02L, and outputting a signal RID3, and a fourth buffer 04L receiving the signal RID3 transmitted from the third buffer 03L, and outputting a signal ROUT.

The replica output circuit 07K and replica input circuit 08K are necessary to have the same characteristics as those of actual circuits for accomplishing delay and phase synchronization. If characteristics between the replica circuits and the actual circuits are not identical to each other, data output position would be deviated.

However, it is actually unavoidable that an error is caused between a replica circuit and an actual circuit because of differences in a layout, power supply, diffusion conditions, and so on.

Japanese Patent Application Publication No. 10-320976 has suggested a method of adjusting access time in a semiconductor device in which a load in a dummy-load circuit included in a dummy circuit is adjusted in accordance with results of measurement of a frequency and an interface. Specifically, the load of the dummy-load circuit is reduced by a degree corresponding to a half of a maximum variance of access time variable in accordance with a frequency of output data.

Japanese Patent Application Publication No. 2000-163999 has suggested a self-timing control circuit including a variable dummy load having an electrically adjustable capacitor load in place of a dummy load having a fixed capacitor load. Thus, it is possible to optimize a capacitor load of a variable dummy load in a step of testing a wafer of a device.

SUMMARY OF THE INVENTION

In view of the above-mentioned problems in the conventional semiconductor integrated circuit device, it is an object of the present invention to provide a semiconductor integrated circuit device which is capable of compensating for a delay error caused between a replica circuit and an actual circuit.

It is also an object of the present invention to provide a method of detecting a delay error between an actual circuit and a replica circuit in a semiconductor integrated circuit device.

In one aspect of the present invention, there is provided a semiconductor integrated circuit device including (a) an actual input circuit, (b) an actual output circuit, (c) a replica input circuit having the same characteristics as those of the actual input circuit, (d) a replica output circuit having the same characteristics as those of the actual input circuit, (e) an oscillating circuit which operates in accordance with external triggers, and (f) a skew-comparing circuit which compares a signal transmitted from the oscillating circuit and passing through the actual input circuit and the actual output circuit, to a signal transmitted from the oscillating circuit and passing through the replica input circuit and the replica output circuit to detect a delay error between the actual input and output circuits and the replica input and output circuits, wherein delays in the replica input and output circuits are compensated for in accordance with the delay error detected by the skew-comparing circuit.

There is further provided a semiconductor integrated circuit device including (a) an actual input circuit, (b) an actual output circuit, (c) a replica input circuit having the same characteristics as those of the actual input circuit, (d) a replica output circuit having the same characteristics as those of the actual input circuit, (e) an oscillating circuit which operates in accordance with external triggers, and (f) a skew-comparing circuit which compares a signal transmitted from the oscillating circuit and passing through the actual output circuit, to a signal transmitted from the oscillating circuit and passing through the replica output circuit to detect a delay error between the actual output circuit and the replica output circuit, wherein delay in the replica output circuit is compensated for in accordance with the delay error detected by the skew-comparing circuit.

In another aspect of the present invention, there is provided, in a semiconductor integrated circuit device including (a) an actual input circuit, (b) an actual output circuit, (c) a replica input circuit having the same characteristics as those of the actual input circuit, and (d) a replica output circuit having the same characteristics as those of the actual input circuit, a method of detecting a delay error between the actual input and output circuits and the replica input and output circuits, including the steps of (a) transmitting a reference signal, (b) having the reference signal passed through the actual input and output circuits, (c) having the reference signal passed through the replica input and output circuits, and (d) comparing the reference signal in the step (b) to the reference signal in the step (c) to detect the delay error.

There is further provided, in a semiconductor integrated circuit device including (a) an actual input circuit, (b) an actual output circuit, (c) a replica input circuit having the same characteristics as those of the actual input circuit, and (d) a replica output circuit having the same characteristics as those of the actual input circuit, a method of detecting a delay error between the actual input and output circuits and the replica input and output circuits, including the steps of (a) transmitting a reference signal, (b) having the reference signal passed through the actual output circuit, (c) having the reference signal passed through the replica output circuit, and (d) comparing the reference signal in the step (b) to the reference signal in the step (c) to detect a delay error between the actual output circuit and the replica output circuit.

The advantages obtained by the aforementioned present invention will be described hereinbelow.

A conventional circuit did not include a circuit for comparing a signal having passed actual input and output circuits to a signal having passed replica input and output circuits. Accordingly, it was not possible to compensate for error caused by differences between an actual circuit and a replica circuit in a layout, power supply, diffusion conditions and so on.

In contrast, the semiconductor integrated circuit device in accordance with the present invention compares a signal having passed actual input and output circuits to a signal having passed replica input and output circuits. Hence, it is possible to compensate for the above-mentioned error with respect to timing.

In addition, the compensation of error in timing can be carried out in a step of testing wafers.

Furthermore, the semiconductor integrated circuit device in accordance with the present invention may be designed to additionally include a selector circuit. Thus, it is possible to compare an actual output circuit to a replica output circuit in accordance with whether a selection signal is activated or not. Hence, it would be possible to separately control a replica output circuit and a replica input circuit, ensuring enhancement characteristics of them.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 1:
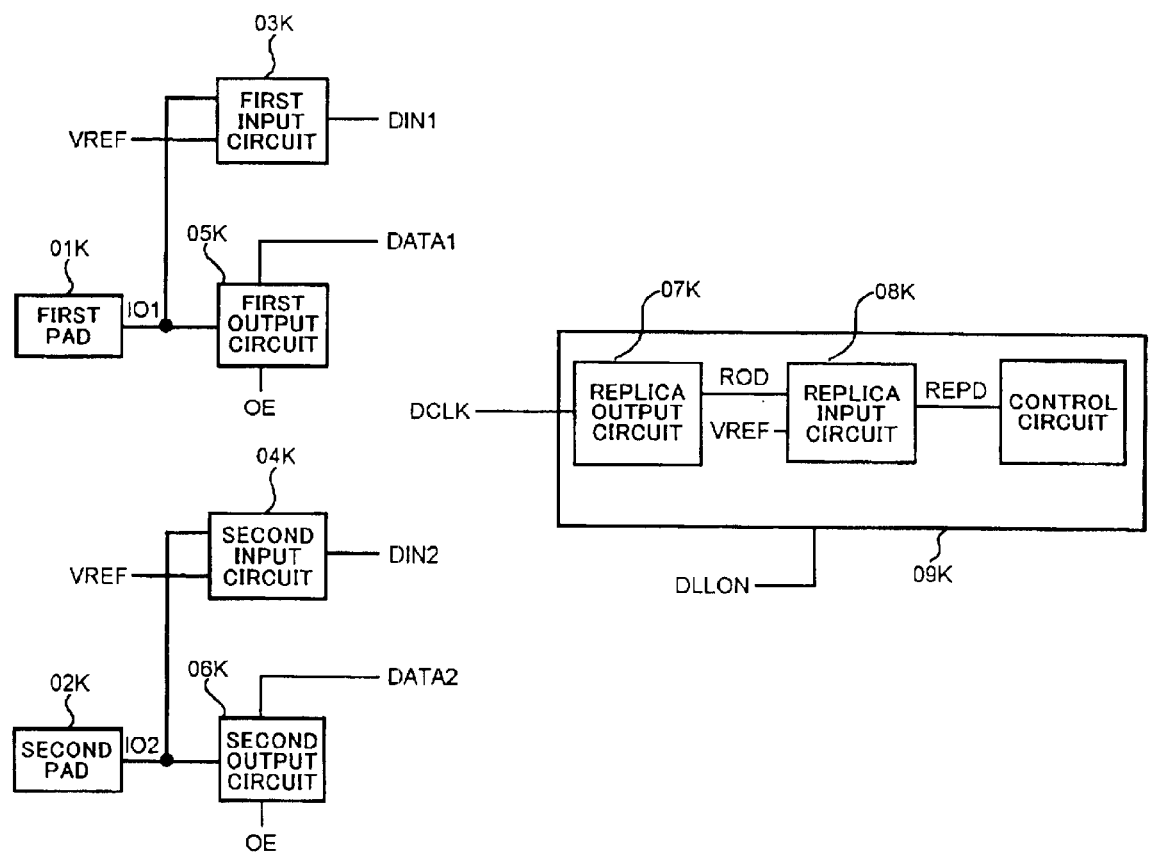
FIG. 1 is a block diagram of a conventional semiconductor integrated circuit device including a delay and phase-synchronization circuit having replica input and output circuits.
Figure 2:
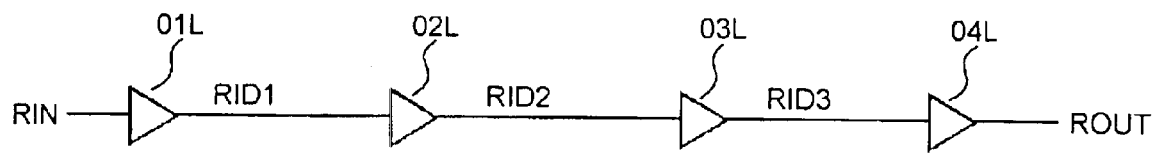
FIG. 2 is a circuit diagram of a replica output circuit in the conventional semiconductor integrated circuit device illustrated in FIG. 1.
Figure 3:
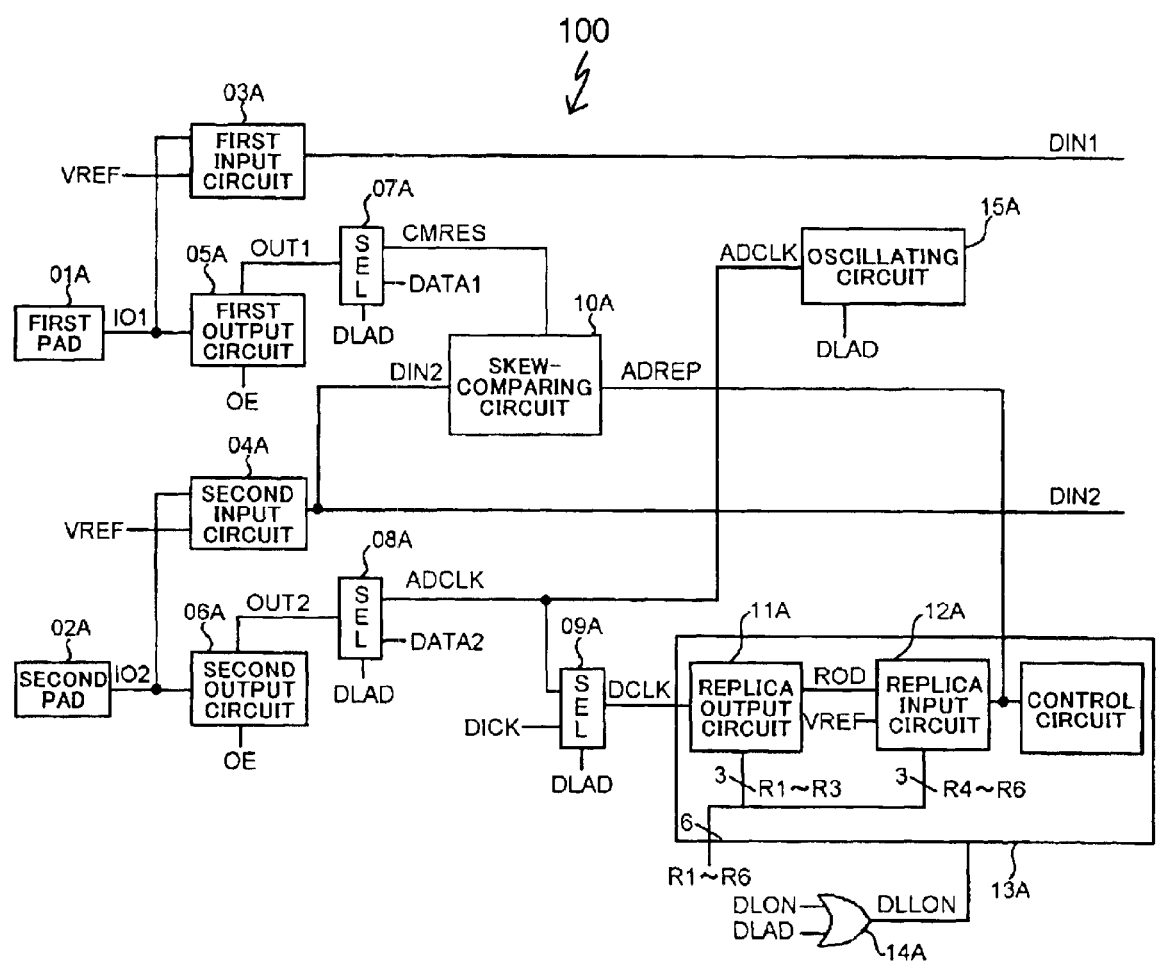
FIG. 3 is a block diagram of a semiconductor integrated circuit device in accordance with the first embodiment of the present invention.

FIG. 3 is a block diagram of a semiconductor integrated circuit device 100 in accordance with the first embodiment of the present invention.

The semiconductor integrated circuit device 100 is comprised of a first pad 01A, a second pad 02A, a first input circuit 03A, a second input circuit 04A, a first output circuit 05A, a second output circuit 06A, a first selector circuit 07A, a second selector circuit 08A, a third selector circuit 09A, a skew-comparing circuit 10A, a delay and phase-synchronization circuit 13A, an OR device 14A, and an oscillating circuit 15A.

Data is input into and output from the semiconductor integrated circuit device 100 through the first and second pads 01A and 02A.

The first pad 01A outputs a signal IO1, and the second pad 02A outputs a signal IO2.

The first input circuit 03A receives a signal VREF as a reference level signal, amplifies the signal IO1 transmitted from the first pad 01A, and outputs the thus amplified signal as a signal DIN1.

The second input circuit 04A receives a signal VREF as a reference level signal, amplifies the signal IO2 transmitted from the second pad 02A, and outputs the thus amplified signal as a signal DIN2.

The first output circuit 05A receives a signal OE as an output enable signal, and outputs a signal OUT1 to the first pad 01A as the signal IO1.

The second output circuit 06A receives a signal OE as an output enable signal, and outputs a signal OUT2 to the second pad 02A as the signal IO2.

The first selector circuit 07A receives a signal DATA1, a signal CLAD, and a signal CMRES transmitted from the skew-comparing circuit 10A. The first selector circuit 07A selects one of the signals CMRES and DATA1 in accordance with the signal DLAD, and outputs the selected signal CMRES or DATA1 to the first output circuit 05A as the signal OUT1.

The second selector circuit 08A receives a signal ADCLK transmitted from the oscillating circuit 15A, a signal DATA2, and a signal DLAD. The second selector circuit 08A selects one of the signals ADCLK and DATA2 in accordance with the signal DLAD, and outputs the selected signal ADCLK or DATA2 to the second output circuit 06A as the signal OUT2.

The third selector circuit 09A receives a signal ADCLK transmitted from the oscillating circuit 15A, a signal DICK, and a signal DLAD. The third selector circuit 09A selects one of the signals ADCLK and DICK in accordance with the signal DLAD, and outputs the selected signal ADCLK or DICK to the delay and phase-synchronization circuit 13A as the signal DCLK.

The skew-comparing circuit 10A compares a skew of a signal ADREP having passed replica circuits in the delay and phase-synchronization circuit 13A, to a skew of the signal DIN2 transmitted from the second input circuit 04A, and outputs the signal CMRES indicative of the result of comparison, to the first selector circuit 07A.

The delay and phase-synchronization circuit 13A includes a replica output circuit 11A and a replica input circuit 12A.

The replica output circuit 11A receives the signal DCLK from the third selector circuit 09A, and outputs a signal ROD to the replica input circuit 12A. The replica output circuit 11A has characteristics variable by register signals R1, R2 and R3 received therein.

The replica input circuit 12A receives a signal VREF as a reference level signal, amplifies the signal ROD transmitted from the replica output circuit 11A, and outputs the thus amplified signal to the skew-comparing circuit 10A as a signal ADREP. The replica input circuit 12A has characteristics variable by register signals R4, R5 and R6 received therein.

The OR device 14A receives signals DLON and DLAD, and outputs a signal DLLON to the delay and phase-synchronization circuit 13A in accordance with OR logic of these two signals. On receipt of the signal DLLON, the delay and phase-synchronization circuit 13A is activated.

The oscillating circuit 15A is activated by the signal DLAD, and outputs the signal ADCLK to the second and third selector circuits 08A and 09A.

The signal DATA1 input into the first selector circuit 07A and the signal DATA2 input into the second selector circuit 08A are signals delayed by the delay and phase-synchronization signal 13A or synchronized with a signal having a synchronized phase.

Figure 4:
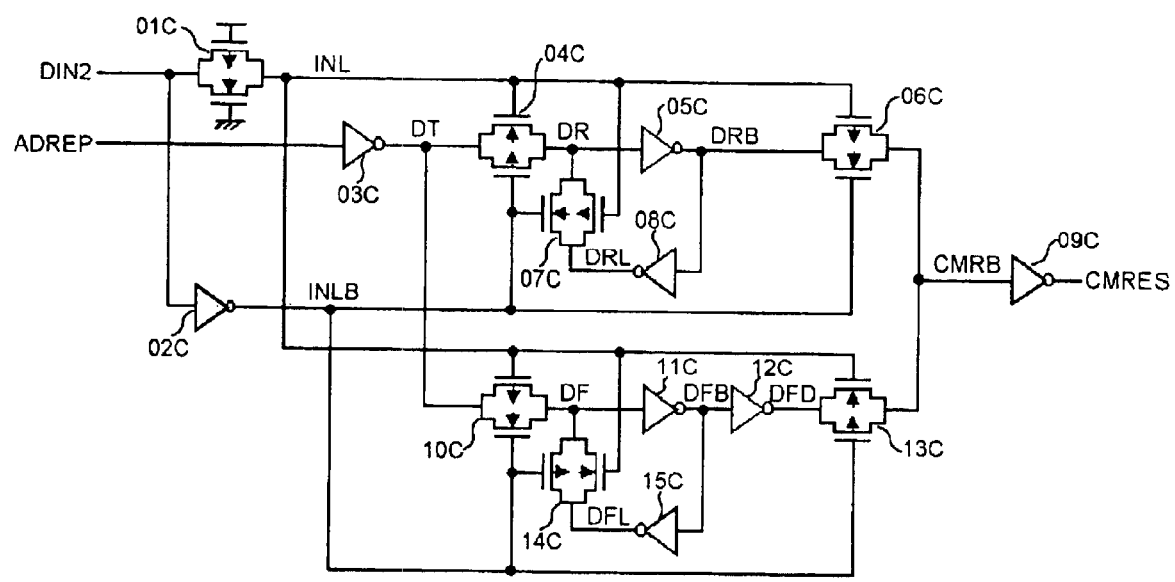
FIG. 4 is a block diagram of a skew-comparing circuit in the semiconductor integrated circuit device illustrated in FIG. 3.

FIG. 4 is a block diagram of the skew-comparing circuit 10A.

The skew-comparing circuit 10A is comprised of a first transfer gate 01C, a second transfer gate 04C, a third transfer gate 06C, a fourth transfer gate 07C, a fifth transfer gate 10C, a sixth transfer gate 13C, a seventh transfer gate 14C, a first inverter 02C, a second inverter 03C, a third inverter 05C, a fourth inverter 08C, a fifth inverter 09C, a sixth inverter 11C, a seventh inverter 12C, and an eighth inverter 15C.

The first transfer gate 01C is comprised of a PMOS transistor and a NMOS transistor. The PMOS and NMOS transistors are electrically connected at their gates to a power source, and receive the signal DIN2 through their sources and a signal INL through their drains.

The second transfer gate 04C is comprised of a PMOS transistor and a NMOS transistor. The PMOS and NMOS transistors receive a signal INLB through their gates, a signal DT through their sources and a signal DR through their drains.

The third transfer gate 06C is comprised of a PMOS transistor and a NMOS transistor. The PMOS transistor receives the signal INLB through a gate thereof, and the NMOS transistor receives the signal INL through a gate thereof. The PMOS and NMOS transistors receive a signal DRB through their sources and a signal CMRB through their drains.

The fourth transfer gate 07C is comprised of a PMOS transistor and a NMOS transistor. The PMOS transistor receives the signal INLB through a gate thereof, and the NMOS transistor receives the signal INL through a gate thereof. The PMOS and NMOS transistors receive a signal DRL through their sources and a signal DR through their drains.

The fifth transfer gate 10C is comprised of a PMOS transistor and a NMOS transistor. The PMOS transistor receives the signal INLB through a gate thereof, and the NMOS transistor receives the signal INL through a gate thereof. The PMOS and NMOS transistors receive a signal DT through their sources and a signal DF through their drains.

The sixth transfer gate 13C is comprised of a PMOS transistor and a NMOS transistor. The PMOS transistor receives the signal INL through a gate thereof, and the NMOS transistor receives the signal INLB through a gate thereof. The PMOS and NMOS transistors receive a signal DFD through their sources and a signal CMRB through their drains.

The seventh transfer gate 14C is comprised of a PMOS transistor and a NMOS transistor. The PMOS transistor receives the signal INL through a gate thereof, and the NMOS transistor receives the signal INLB through a gate thereof. The PMOS and NMOS transistors receive a signal DFL through their sources and a signal DF through their drains.

The first inverter 02C receives the signal DIN2, and output the signal INLB.

The second inverter 03C receives the signal ADREP, and output the signal DT.

The third inverter 05C receives the signal DR, and output the signal DRB.

The fourth inverter 08C receives the signal DRB, and output the signal DRL.

The fifth inverter 09C receives the signal CMRB, and output the signal CMRES.

The sixth inverter 11C receives the signal DF, and output the signal DFB.

The seventh inverter 12C receives the signal DFB, and output the signal DFD.

The eighth inverter 15C receives the signal DFB, and output the signal DFL.

Figure 5:
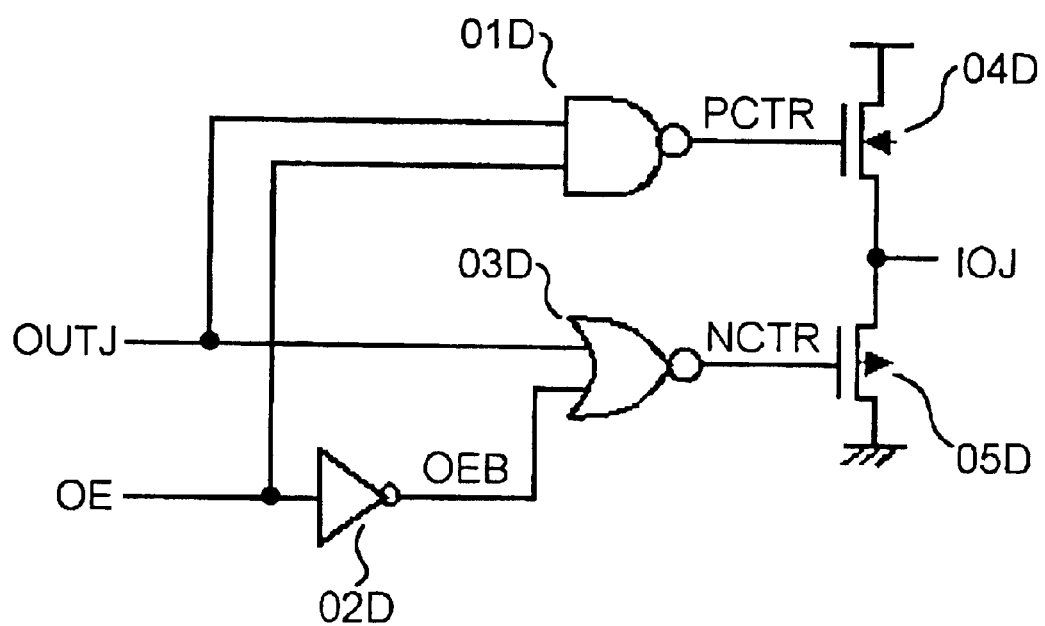
FIG. 5 is a block diagram of a first output circuit in the semiconductor integrated circuit device illustrated in FIG. 3.

FIG. 5 is a block diagram showing a structure of an example of the first output circuit 05A.

The first output circuit 05A is comprised of a NAND device 01D receiving signals OUTJ and OE, and outputting a signal PCTR, an inverter 02D receiving a signal OE, and outputting a signal OEB, a NOR device 03D receiving the signals OUTJ and OEB, and outputting a signal NCTR, a PMOS transistor 04D, and a NMOS transistor 05D.

The PMOS transistor 04D receives the signal PCTR through a gate thereof and the signal IOJ through a drain thereof. The PMOS transistor 04D has a source electrically connected to a power source.

The NMOS transistor 05D receives the signal NCTR through a gate thereof and the signal IOJ through a drain thereof. The NMOS transistor 05D has a source grounded.

The second output circuit 06A has the same structure as that of the first input circuit 05A.

Figure 6:
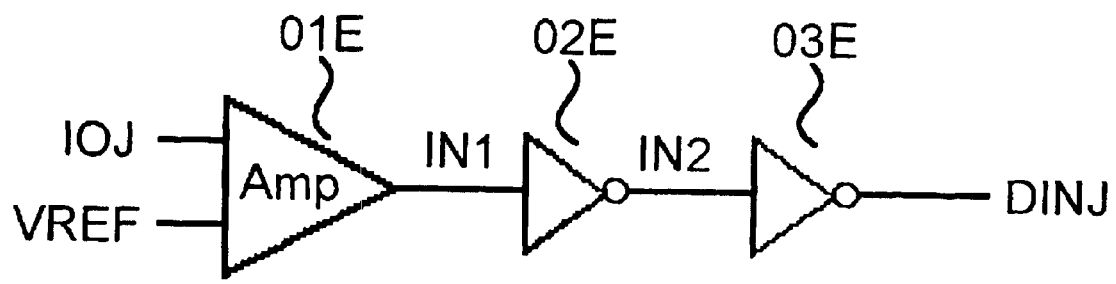
FIG. 6 is a block diagram of a first input circuit in the semiconductor integrated circuit device illustrated in FIG. 3.

FIG. 6 is a block diagram showing a structure of an example of the first input circuit 03A.

The first input circuit 03A is comprised of a differential amplifier 01E receiving a signal VREF as a reference level signal, differentially amplifies the signal IOJ, and outputs a signal IN1, an inverter 02E receiving the signal IN1, and outputting the inverted signal IN1 as a signal IN2, and an inverter 03E receiving the signal IN2, and outputting the inverted signal IN2 as a signal DINJ.

The second input circuit 04A has the same structure as that of the first input circuit 03A.

Figure 7:
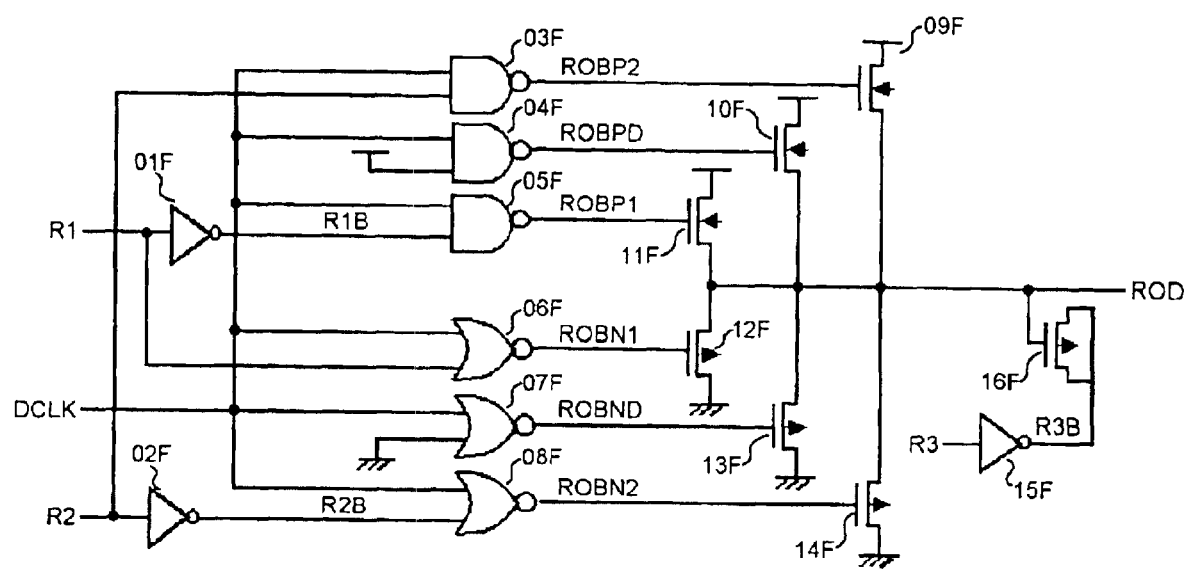
FIG. 7 is a block diagram of a replica output circuit in the semiconductor integrated circuit device illustrated in FIG. 3.

FIG. 7 is a block diagram showing a structure of an example of the replica output circuit 11A.

The replica output circuit 11A is comprised of a first inverter 01F, a second inverter 02F, a third inverter 15F, a first NAND device 03F, a second NAND device 04F, a third NAND device 05F, a first NOR device 06F, a second NOR device 07F, a third NOR device 08F, a first PMOS transistor 09F, a second PMOS transistor 10F, a third PMOS transistor 11F, a first NMOS transistor 12F, a second NMOS transistor 13F, a third NMOS transistor 14F, and a fourth NMOS transistor 16F.

The first inverter 01F receives a signal R1, and outputs a signal R1B.

The second inverter 02F receives a signal R2, and outputs a signal R2B.

The third inverter 15F receives a signal R3, and outputs a signal R3B.

The first NAND device 03F receives the signals DCLK and R2, and outputs a signal ROBP2.

The second NAND device 04F receives the signal DCLK, and is electrically connected to a power source through one of input terminals. The second NAND device 04F outputs a signal ROBPD.

The third NAND device 05F receives the signals DCLK and R1B, and outputs a signal ROBP1.

The first NOR device 06F receives the signals DCLK and R1, and outputs a signal ROBN1.

The second NOR device 07F receives the signal DCLK, and is grounded through one of input terminals. The second NOR device 07F outputs a signal ROBND.

The third NOR device 08F receives the signals DCLK and R2B, and outputs a signal ROBN2.

The first PMOS transistor 09F receives the signal ROBP2 through a gate thereof, and the signal ROD through a drain thereof. The first PMOS transistor 09F has a source electrically connected to a power source.

The second PMOS transistor 10F receives the signal ROBPD through a gate thereof, and the signal ROD through a drain thereof. The second PMOS transistor 10F has a source electrically connected to a power source.

The third PMOS transistor 11F receives the signal ROBP1 through a gate thereof, and the signal ROD through a drain thereof. The third PMOS transistor 11F has a source electrically connected to a power source.

The first NMOS transistor 12F receives the signal ROBN1 through a gate thereof, and the signal ROD through a drain thereof. The first NMOS transistor 12F has a source grounded.

The second NMOS transistor 13F receives the signal ROBND through a gate thereof, and the signal ROD through a drain thereof. The second NMOS transistor 13F has a source grounded.

The third NMOS transistor 14F receives the signal ROBN2 through a gate thereof, and the signal ROD through a drain thereof. The third NMOS transistor 14F has a source grounded.

Figure 8:
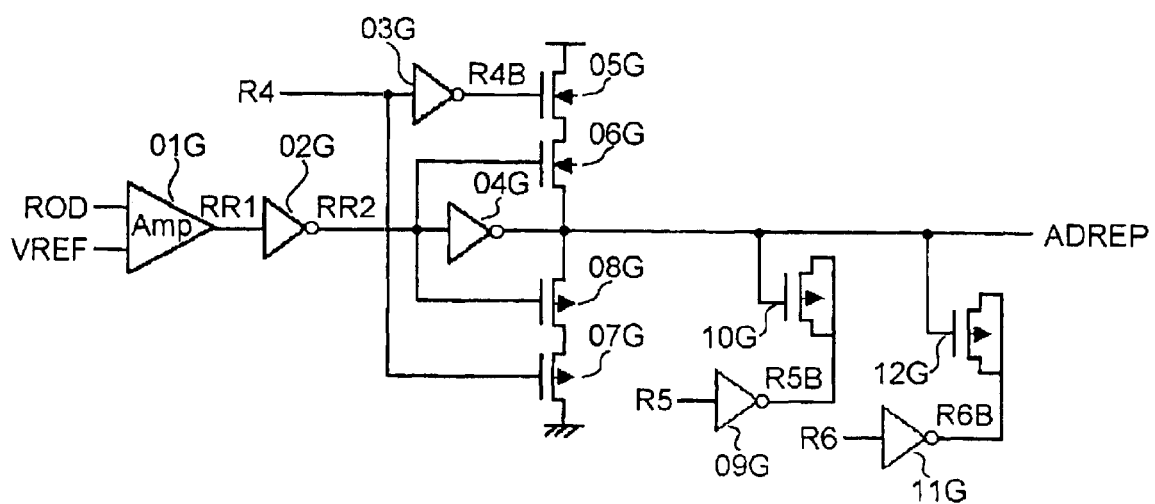
FIG. 8 is a block diagram of a replica input circuit in the semiconductor integrated circuit device illustrated in FIG. 3.

The fourth NMOS transistor 16F receives the signal ROD through a gate thereof, and the signal R3B through a drain and a source thereof FIG. 8 is a block diagram showing a structure of an example of the replica input circuit 12A.

The replica input circuit 12A is comprised of a differential amplifier 01G, a first inverter 02G, a second inverter 03G, a third inverter 04G, a fourth inverter 09G, a fifth inverter 11G, a first PMOS transistor 05G, a second PMOS transistor 06G, a first NMOS transistor 07G, a second NMOS transistor 08G, a third NMOS transistor 10G, and a fourth NMOS transistor 11G.

The differential amplifier 01G receives the signal VREF as a reference level signal, amplifies the signal ROD, and outputs the thus amplified signal as a signal RR1.

The first inverter 02G receives the signal RR1, and outputs a signal RR2.

The second inverter 03G receives the signal R4, and outputs a signal R4B.

The third inverter 04G receives the signal RR2, and outputs the signal ADREP.

The fourth inverter 09G receives a signal R5, and outputs a signal R5B.

The fifth inverter 11G receives a signal R6, and outputs a signal R6B.

The first PMOS transistor 05G receives the signal R4B through a gate thereof. The first PMOS transistor 05G has a source electrically connected to a power source, and a drain electrically connected to a source of the second PMOS transistor 06G.

The second PMOS transistor 06G receives the signal RR2 through a gate thereof, and the signal ADREP through a drain thereof. The second PMOS transistor 06G has a source electrically connected to a drain of the first PMOS transistor 05G.

The first NMOS transistor 07G receives the signal R4 through a gate thereof. The first NMOS transistor 07G has a source grounded, and a drain electrically connected to a source of the second NMOS transistor 08G.

The second NMOS transistor 08G receives the signal RR2 through a gate thereof, and the signal ADREP through a drain thereof. The second NMOS transistor 08G has a source electrically connected to a drain of the third NMOS transistor 07G.

The third NMOS transistor 10G receives the signal ADREP through a gate thereof, and the signal R5B through a drain and a source thereof.

The fourth NMOS transistor 12G receives the signal ADREP through a gate thereof, and the signal R6B through a drain and a source thereof.

Figure 9:
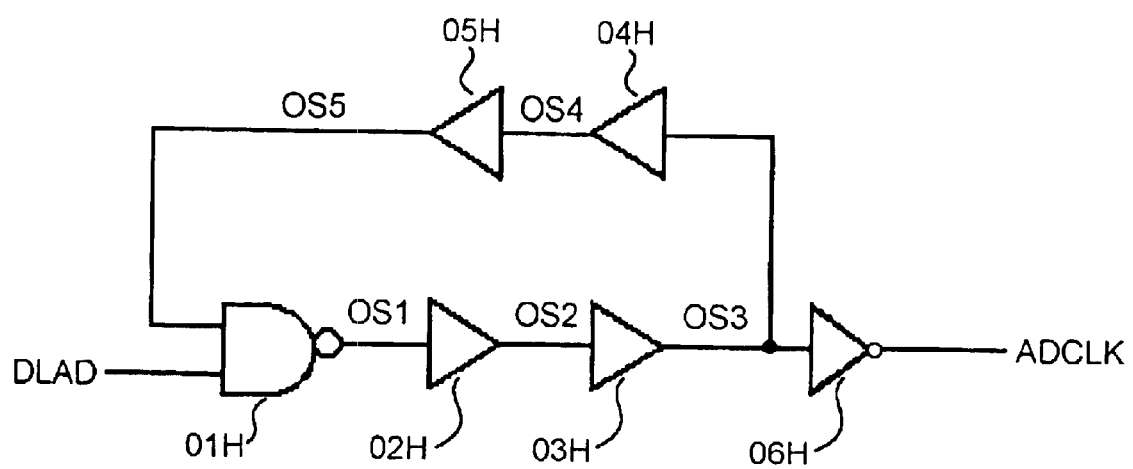
FIG. 9 is a block diagram of an oscillating circuit in the semiconductor integrated circuit device illustrated in FIG. 3.

FIG. 9 is a block diagram showing a structure of an example of the oscillating circuit 15A.

The oscillating circuit 15A is comprised of a NAND device 01H receiving a signal OS5 and outputting a signal OS1, a first buffer 02H receiving the signal OS1 and outputting a signal OS2, a second buffer 03H receiving the signal OS2 and outputting a signal OS3, a third buffer 04H receiving the signal OS3 and outputting a signal OS4, a fourth buffer 05H and outputting a signal OS5, and an inverter 06H receiving the signal OS3 and outputting a signal ADCLK.

Figure 10:
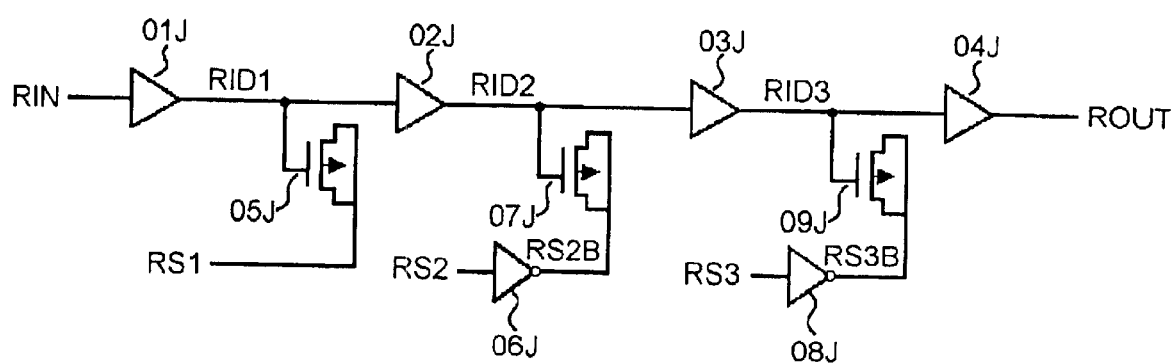
FIG. 10 is a block diagram of a replica output circuit.

FIG. 10 is a block diagram of a delay circuit as a component of the replica output or input circuit 11A or 12A.

As mentioned later, the replica output or input circuit 11A or 12A may be constructed using the delay circuit.

The illustrated delay circuit is comprised of a first buffer 01J receiving a signal RIN and outputting a signal RID1, a second buffer 02J receiving the signal RID1 and outputting a signal RID2, a third buffer 03J receiving the signal RID2 and outputting a signal RID3, a fourth buffer 04J receiving the signal RID3 and outputting a signal ROUT, a first NMOS transistor 05J receiving the signal RID3 through a gate thereof and further receiving the signal RS1 through a source and a drain thereof, a first inverter 06J receiving the signal RS2 and outputting a signal RS2B, a second NMOS transistor 07J receiving the signal RID2 through a gate thereof and further receiving the signal RS2B through a source and a drain thereof, a second inverter 08J receiving the signal RS3 and outputting the signal RS3B, and a third NMOS transistor 09J receiving the signal RID3 through a gate thereof and further receiving the signal RS3B through a source and a drain thereof.

If the delay circuit illustrated in FIG. 10 is constructed as the replica output circuit 11A, the signal RIN is replaced with the signal DCLK, and the signal ROUT is replaced with the signal ROD.

If the delay circuit illustrated in FIG. 10 is constructed as the replica input circuit 12A, the signal RIN is replaced with the signal ROD, and the signal ROUT is replaced with the signal ADCLK. It is not necessary for the delay circuit constructed as the replica input circuit 12A to receive the signal VREF which is necessary to be input into the replica input circuit 12A as a reference level signal.

Hereinbelow is explained an operation of the semiconductor integrated circuit device 100 in accordance with the first embodiment.

By activating the signal DLAD which can be comprised of test mode or external triggers, for instance, the oscillating circuit 15A which produces a frequency for actual operation of the semiconductor integrated circuit device is activated.

When the DLAD is activated, the first selector circuit 07A selects the signal CMRES, the second selector 08A selects the signal ADCLK, and the third selector 09A selects the signal ADCLK.

Thus, the signal ADCLK transmitted from the oscillating circuit 15A is input into the second input circuit 04A through the second selector circuit 08A and the second output circuit 06A, and is output from the second input circuit 04A as the signal DIN2 to the skew-comparing circuit 10A. A path from the oscillating circuit 15A to the skew-comparing circuit 10A through the second selector circuit 08A, the second output circuit 06A and the second input circuit 04A is called an actual-circuit path hereinbelow.

Thus, the signal ADCLK transmitted from the oscillating circuit 15A is input into the skew-comparing circuit 10A as the signal ADREP through the third selector circuit 09A, the replica output circuit 11A designed to have the same characteristics as those of the second output circuit 06A, and the replica input circuit 12A designed to have the same characteristics as those of the second input circuit 04A. A path from the oscillating circuit 15A to the skew-comparing circuit 10A through the third selector circuit 09A, the replica output circuit 11A and the replica input circuit 12A is called a replica-circuit path hereinbelow.

Delay in the replica-circuit path varies in accordance with register signals R1 to R3 input into the replica output circuit 11A and register signals R4 to R6 input into the replica input circuit 12A. Thus, the delay can be controlled by the register signals R1 to R6. Hence, by designing the skew-comparing circuit 10A to be comprised of a flip-flop circuit which varies the signal CMRES when a delay in the replica-circuit path is greater or smaller than a delay in the actual-circuit path, it is possible to detect register values of the register signals R1 to R6 by which the signal CMRES varies, and find register values of the register signals R1 to R6 by which a delay in the actual-circuit path is equal to a delay in the replica-circuit path.

For instance, in the skew-comparing circuit 10A illustrated in FIG. 4, the signal CMRES is turned to H level from L level when a delay in the replica-circuit path is greater than a delay in the actual-circuit path, and turned to L level from H level when a delay in the replica-circuit path is smaller than a delay in the actual-circuit path.

As illustrated in FIG. 4, the flip-flop operation for latching the signal ADREP by using the input signal DIN2 as a clock signal CLK is accomplished by the signal DT obtained by inverting the signal ADREP, the signal INL obtained by having the signal DIN2 passed through the first transfer gate 01C, the signal INLB obtained by inverting the signal DIN2, the signal DR obtained by having the signal DT passed through the second transfer gate 04C while the signal INL is L level and the signal INLB is H level, the signal DRB obtained by inverting the signal DR, the fourth transfer gate 07C and the fourth inverter 08C which store data while the signal INL is H level and the signal INLB is L level, the third transfer gate 06C which outputs the signal DRB as the signal CMRB while the signal INL is H level and the signal INLB is L level, the signal DF obtained by having the signal DT passed through the fifth transfer gate 10C while the signal INL is H level and the signal INLB is L level, the signal DFB obtained by inverting the signal DF, the signal DFD obtained by inverting the signal DFB, the seventh transfer gate 14C and the eighth inverter 15C which store data while the signal INL is L level and the signal INLB is H level, the seventh transfer gate 13C which outputs the signal DFD as the signal CMRB while the signal INL is L level and the signal INLB is H level, and the signal CMRES obtained by inverting the signal CMRB.

If the signal ADREP having passed through the replica-circuit path is earlier than the signal DIN2 having passed through the actual-circuit path, the signal ADREP is turned to H level when the signal DIN2 is turned to H level, or the signal ADREP is turned to L level when the signal DIN2 is turned to L level. Hence, the signal CMRES, that is, a signal output from the skew-comparing circuit 10A is L level.

In contrast, if the signal ADREP having passed through the replica-circuit path is later than the signal DIN2 having passed through the actual-circuit path, the signal ADREP is turned to L level when the signal DIN2 is turned to H level, or the signal ADREP is turned to H level when the signal DIN2 is turned to L level. Hence, the signal CMRES is H level.

Thus, the skew-comparing circuit 10A can detect a difference in delay between the signal DIN2 and the signal ADREP.

The signal CMRES is output to the first pad 01A through the first output circuit 05A, and is measured by means of an external measurement unit such as a tester. Thus, it is possible to determine the register signals R1 to R6 having a unique value by which a delay in the actual-circuit path is equal to a delay in the replica-circuit path.

A fuse may be prepared in association with the register signals R1 to R6. It would be possible to equalize characteristics of the actual circuit to characteristics of the replica circuit by cutting the fuse associated with the unique register value by which a delay in the actual-circuit path is equal to a delay in the replica-circuit path.

A conventional circuit did not include a circuit for comparing a signal having passed through an actual circuit (the first output circuit 05K and the second input circuit 04K) to a signal having passed through the replica output and input circuits 11A and 12A. Accordingly, it was not possible to compensate for error caused by differences between an actual circuit and a replica circuit in a layout, power supply, diffusion conditions and so on.

In contrast, the semiconductor integrated circuit device 100 in accordance with the first embodiment compares a signal having passed through the actual output and input circuits to a signal having passed through the replica output and input circuits. Hence, it is possible to compensate for the above-mentioned error with respect to timing.

In addition, the compensation of error or adjustment in access timing can be carried out in a step of testing wafers.

[Second Embodiment]

Figure 11:
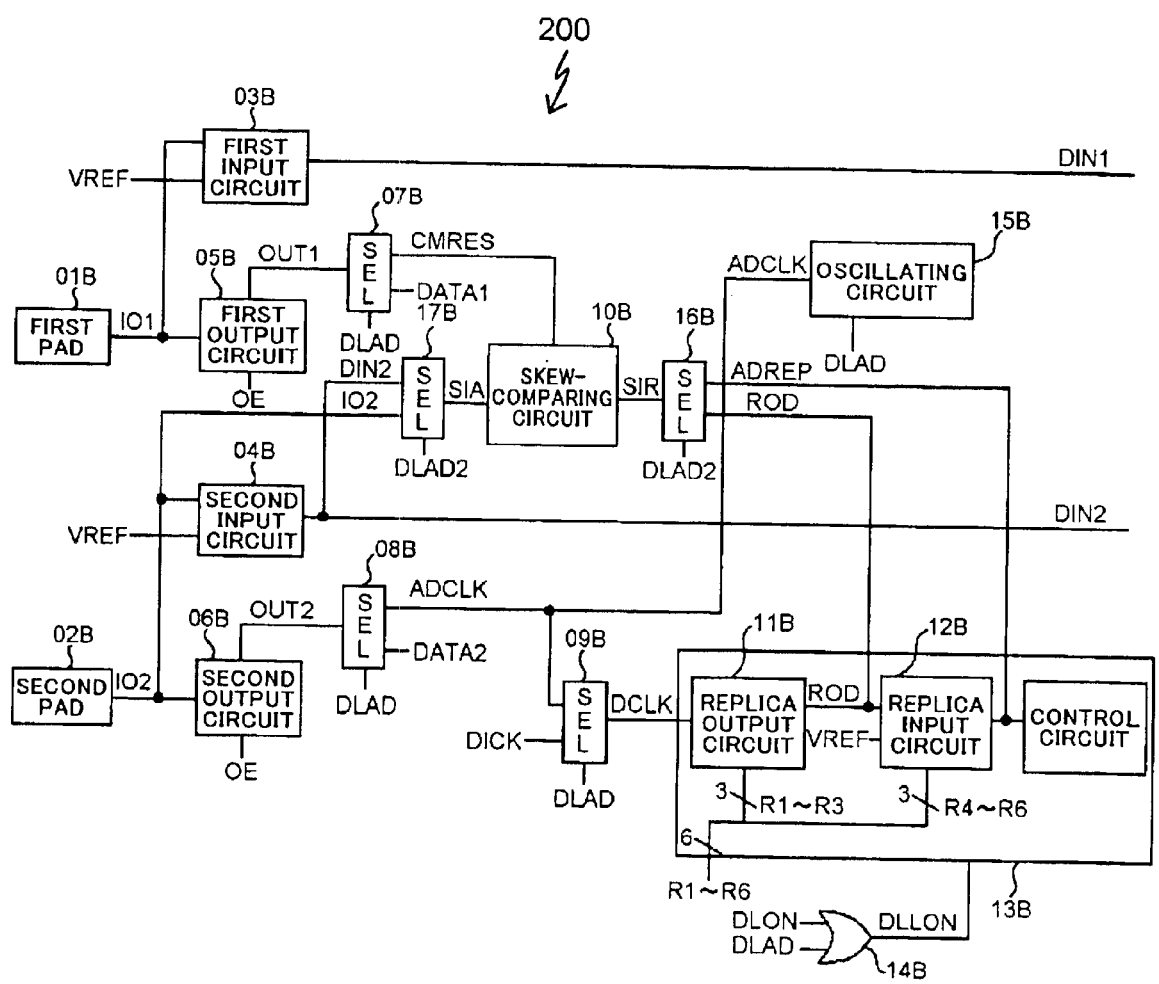
FIG. 11 is a block diagram of a semiconductor integrated circuit device in accordance with the second embodiment of the present invention.

FIG. 11 is a block diagram of a semiconductor integrated circuit device 200 in accordance with the second embodiment of the present invention.

The semiconductor integrated circuit device 200 in accordance with the second embodiment is structurally different from the semiconductor integrated circuit device 100 in accordance with the first embodiment in additionally including a fourth selector circuit 16B and a fifth selector circuit 17B.

The fourth selector 16B receives the signal ROD transmitted from the replica output circuit 11B, the signal ADREP transmitted from the replica input circuit 12B, and a signal DLAD2. In accordance with the signal DLAD2, the fourth selector 16B selects one of the signals ROD and ADREP, and outputs the selected signal ROD or ADREP to the skew-comparing circuit 10B as an output signal SIR.

Specifically, the fourth selector 16B selects and outputs the signal ROD as the output signal SIR when the signal DLAD2 is activated, and selects and outputs the signal ADREP as the output signal SIR when the signal DLAD2 is not activated.

The fifth selector 17B receives the signal IO2 transmitted from the second pad 02B, the signal DIN2 transmitted from the second input circuit 04B, and the signal DLAD2. In accordance with the signal DLAD2, the fifth selector 17B selects one of the signals IO2 and DIN2, and outputs the selected signal IO2 or DIN2 to the skew-comparing circuit 10B as an output signal SIA.

Specifically, the fifth selector 17B selects and outputs the signal IO2 as the output signal SIA when the signal DLAD2 is activated, and selects and outputs the signal DIN2 as the output signal SIA when the signal DLAD2 is not activated.

That is, when the signal DLAD2 is activated, the skew-comparing circuit 10B receives the signal ROD from the fourth selector circuit 16B and the signal IO2 from the fifth selector circuit 17B. Thus, the skew-comparing circuit 10B receives the signal SIA containing a delay of the second output circuit 06B and a delay of the second and fifth selector circuits 08B and 17B, and the signal SIR containing a delay of the replica output circuit 11B and a delay of the third and fourth selector circuits 09B and 16B.

Under such conditions, the skew-comparing circuit 10B compares skews to each other, and controls characteristics of the replica output circuit 11B through the register signals R1 to R6. Thus, the replica output circuit 11B could have the same characteristics as those of the actual output circuit.

When the signal DLAD2 is not activated, the skew-comparing circuit 10B receives the signal ADREP from the fourth selector circuit 16B and the signal DIN2 from the fifth selector circuit 17B.

Under such conditions, the skew-comparing circuit 10B readjusts a register value of the replica output circuit 11B having been adjusted before, and adjusts a delay of the replica input circuit 12B through the register signals R4 to R6.

Thus, the replica input circuit 12B could have the same characteristics as those of the actual input circuit.

In accordance with the semiconductor integrated circuit device 200 including the fourth and fifth selector circuits 16B and 17B, it is possible to compare only the actual output circuit to the replica output circuit 11B whether the signal DLAD2 is activated or not. Thus, it is possible to separately adjust the replica output circuit 11B and the replica input circuit 12B by carrying out the above-mentioned two adjustments, ensuring enhancement in characteristics of the replica circuit.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-354993 filed on Dec. 6, 2002 including specification, claims, drawings and summary is incorporated herein by reference in its entirety.

What is claimed is:

1. A semiconductor integrated circuit device comprising:
   (a) an actual input circuit;
   (b) an actual output circuit;
   (c) a replica input circuit having the same characteristics as those of said actual input circuit;
   (d) a replica output circuit having the same characteristics as those of said actual input circuit;
   (e) an oscillating circuit which operates in accordance with external triggers; and
   (f) a skew-comparing circuit which compares a signal transmitted from said oscillating circuit and passing through said actual input circuit and said actual output circuit, to a signal transmitted from said oscillating circuit and passing through said replica input circuit and said replica output circuit to detect a delay error between said actual input and output circuits and said replica input and output circuits,
   wherein delays in said replica input and output circuits are compensated for in accordance with said delay error detected by said skew-comparing circuit.

2. A semiconductor integrated circuit device comprising:
   (a) an actual input circuit;
   (b) an actual output circuit;
   (c) a replica input circuit having the same characteristics as those of said actual input circuit;
   (d) a replica output circuit having the same characteristics as those of said actual input circuit;

(e) an oscillating circuit which operates in accordance with external triggers; and (f) a skew-comparing circuit which compares a signal transmitted from said oscillating circuit and passing through said actual output circuit, to a signal transmitted from said oscillating circuit and passing through said replica output circuit to detect a delay error between said actual output circuit and said replica output circuit, wherein delay in said replica output circuit is compensated for in accordance with said delay error detected by said skew-comparing circuit.

3. In a semiconductor integrated circuit device including (a) an actual input circuit, (b) an actual output circuit, (c) a replica input circuit having the same characteristics as those of said actual input circuit, and (d) a replica output circuit having the same characteristics as those of said actual input circuit, a method of detecting a delay error between said actual input and output circuits and said replica input and output circuits, including the steps of:

(a) transmitting a reference signal;

(b) having said reference signal passed through said actual input and output circuits;

(c) having said reference signal passed through said replica input and output circuits; and (d) comparing said reference signal in said step (b) to said reference signal in said step (c) to detect said delay error.

4. In a semiconductor integrated circuit device including (a) an actual input circuit, (b) an actual output circuit, (c) a replica input circuit having the same characteristics as those of said actual input circuit, and (d) a replica output circuit having the same characteristics as those of said actual input circuit, a method of detecting a delay error between said actual input and output circuits and said replica input and output circuits, including the steps of:

(a) transmitting a reference signal;

(b) having said reference signal passed through said actual output circuit;

(c) having said reference signal passed through said replica output circuit; and (d) comparing said reference signal in said step (b) to said reference signal in said step (c) to detect a delay error between said actual output circuit and said replica output circuit.

* * * * *